US008872091B2

(12) United States Patent
Saitou et al.

(10) Patent No.: US 8,872,091 B2
(45) Date of Patent: Oct. 28, 2014

(54) SOLID-STATE IMAGING DEVICE

(71) Applicant: Panasonic Corporation, Osaka (JP)

(72) Inventors: Shigeru Saitou, Kyoto (JP); Kazutoshi Onozawa, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/722,527

(22) Filed: Dec. 20, 2012

(65) Prior Publication Data

US 2013/0105666 A1 May 2, 2013

Related U.S. Application Data

(63) Continuation of application No. PCT/JP2011/000323, filed on Jan. 21, 2011.

(30) Foreign Application Priority Data

Jul. 1, 2010 (JP) .................................. 2010-151396

(51) Int. Cl.
*H01L 27/00* (2006.01)
*H01L 27/146* (2006.01)
*G02B 27/44* (2006.01)
*H04N 1/03* (2006.01)
*G02B 3/00* (2006.01)

(52) U.S. Cl.
CPC ........ *H01L 27/146* (2013.01); *H01L 27/14627* (2013.01); *H01L 27/14629* (2013.01); *G02B 27/44* (2013.01); *H04N 1/0306* (2013.01); *G02B 3/0043* (2013.01)
USPC ........ 250/208.1; 348/275; 348/294; 359/565; 359/574; 359/575

(58) Field of Classification Search
CPC ............ H01L 27/146; H01L 27/14629; G02B 3/0043; G02B 27/44
USPC ................ 250/208.1; 348/294, 275; 359/565, 359/574–575
See application file for complete search history.

(56) References Cited

U.S. PATENT DOCUMENTS

| 7,663,084 B2 | 2/2010 | Toshikiyo et al. |
| 7,692,129 B2 | 4/2010 | Toshikiyo et al. |
| 7,851,837 B2 | 12/2010 | Toshikiyo |
| 8,004,595 B2 | 8/2011 | Onozawa |

(Continued)

FOREIGN PATENT DOCUMENTS

| JP | 2006-351972 A | 12/2006 |
| JP | 2009-135236 A | 6/2009 |

(Continued)

OTHER PUBLICATIONS

International Search Report issued in International Patent Application No. PCT/JP2011/000323 dated May 10, 2011.

*Primary Examiner* — Georgia Y Epps
*Assistant Examiner* — Kevin Wyatt
(74) *Attorney, Agent, or Firm* — McDermott Will & Emery LLP

(57) ABSTRACT

The solid-state imaging device includes light collecting elements each of which includes a first light-transmissive film group and a second light transmissive film group adjacent to each other. The first light-transmissive film group and the second light transmissive film group have mutually different effective refractive index distributions for guiding at least two types of incident light rays to the light receiving element.

18 Claims, 13 Drawing Sheets

(56) References Cited

U.S. PATENT DOCUMENTS

| | | |
|---|---|---|
| 8,018,508 B2 | 9/2011 | Toshikiyo |
| 8,148,672 B2 * | 4/2012 | Toda .............................. 250/216 |
| 2006/0284052 A1 | 12/2006 | Toshikiyo et al. |
| 2007/0146531 A1 | 6/2007 | Toshikiyo |
| 2007/0164329 A1 | 7/2007 | Toshikiyo |
| 2008/0076039 A1 * | 3/2008 | Ishii et al. ......................... 430/5 |
| 2008/0185500 A1 * | 8/2008 | Toshikiyo .................. 250/208.1 |
| 2008/0291303 A1 * | 11/2008 | Onozawa et al. ............. 348/294 |
| 2009/0020840 A1 | 1/2009 | Toshikiyo et al. |
| 2009/0141153 A1 | 6/2009 | Onozawa |
| 2011/0221022 A1 * | 9/2011 | Toda .............................. 257/432 |
| 2012/0033126 A1 * | 2/2012 | Ishii .............................. 348/340 |

FOREIGN PATENT DOCUMENTS

| | | |
|---|---|---|
| JP | 2009-276717 A | 11/2009 |
| WO | WO-2005/059607 A1 | 6/2005 |
| WO | WO-2005/101067 A1 | 10/2005 |

\* cited by examiner

US 8,872,091 B2

SOLID-STATE IMAGING DEVICE

CROSS REFERENCE TO RELATED APPLICATIONS

This is a continuation application of PCT International Application No. PCT/JP2011/000323 filed on Jan. 21, 2011, designating the United States of America, which is based on and claims priority of Japanese Patent Application No. 2010-151396 filed on Jul. 1, 2010. The entire disclosures of the above-identified applications, including the specifications, drawings and claims are incorporated herein by reference in their entirety.

FIELD

The present invention relates to a solid-state imaging device used for a digital camera or the like.

BACKGROUND

With a spread of digital cameras and mobile phones with a camera, the market for solid-state imaging devices has been recently expanded significantly. Furthermore, single lens reflex digital cameras in which various kinds of lenses ranging from wide-angle lenses to telescopic lenses can be exchanged in use are becoming popular.

Demands for slimmer digital cameras and the like have been still high. In other words, this means that the lens used in such a slimmer camera has a short focus, and that incident light to the solid-state imaging device has a wide angle (when measured with respect to the perpendicular axis of an incident surface of the solid-state imaging device).

A solid-state imaging device such as a charge coupled device (CCD) image sensor and a complementary metal oxide semiconductor (CMOS) image sensor includes a two-dimensional array of semiconductor integrated circuits (unit pixels) each including a light receiving unit, and thereby converts light signals from an object into electric signals.

Here, the solid-state imaging device has a sensitivity defined based on the magnitudes of current output from the light receiving elements with respect to the amounts of incident light. For this reason, reliably guiding incident light to the light receiving elements is a very important factor for increasing the overall sensitivity of the solid-state imaging device.

In order to solve a problem which occurs in the case of wide-angle incident light, a solid-state imaging device has been proposed which includes gradient index lenses having a fine structure smaller than or approximately the same as the wavelength of incident light and thus having an effective refractive index (see Patent Literature 1).

More specifically, the solid-state imaging device has, in the center part of the imaging region, such a gradient index lens that has an effective refractive index symmetrical to the center point of the unit pixel. The gradient index lens is formed with a combination of zones which respectively have the shapes of concentric arcs each having a line width smaller than or approximately the same as the wavelength of incident light.

More specifically, the solid-state imaging device has, in the marginal part of the imaging region, such a gradient index lens that has an effective refractive index asymmetrical to the center point of the unit pixel. The gradient index lens is formed with a combination of zones which respectively have the shapes of concentric arcs each having a line width smaller than or approximately the same as the wavelength of incident light, and the center point of the concentric arcs is shifted (offset) from the center point of the unit pixel.

CITATION LIST

Patent Literature

[PTL 1]
Japanese Unexamined Patent Application Publication No. 2006-351972.

SUMMARY

Technical Problem

However, in the case of the solid-state imaging device disclosed in Patent Literature 1, each of the unit pixels in the imaging region thereof can guide, into a corresponding light receiving element, wide-angle incident light passed through a wide-angle lens. However, in the case of the solid-state imaging device disclosed in Patent Literature 1, some of the unit pixels in the imaging region thereof cannot guide, into the corresponding light receiving element, telecentric incident light passed through a telescopic lens (here, a main light ray of the telecentric incident light is approximately parallel to the optical axis).

In other words, the conventional solid-state imaging device cannot properly guide two types of light rays having different properties into its light receiving elements.

The present invention has been made to solve the aforementioned problem with an aim to provide a solid-state imaging device which is capable of guiding two types of light rays having mutually different properties into its light receiving elements.

Solution to Problem

In order to achieve the aforementioned aim, a solid-state imaging device according to an aspect of the present invention performs imaging using light incident on an imaging region formed on a flat surface. The solid-state imaging device includes a plurality of unit pixels arranged two-dimensionally in the imaging region. Each of the plurality of unit pixels includes: a light receiving element; and a light collecting element for guiding incident light to the light receiving element. The light collecting element included in at least one of the plurality of unit pixels is a multi-structural light collecting element which includes a first light-transmissive film group and a second light-transmissive film group arranged adjacent to each other. Each of the first light-transmissive film group and the second light-transmissive film group includes a plurality of light-transmissive films each of which has a shape of an arc concentric about the center axis perpendicular to the imaging region. The first light-transmissive film group and the second light-transmissive film group have mutually different effective refractive index distributions for guiding at least two types of incident light rays which make up the incident light to the light receiving element. The first light-transmissive film group and the second light-transmissive film group share a boundary which is a straight line. The boundary is orthogonal to a line which connects the center point of the imaging region and the center point of the unit pixel including the multi-structural light collecting element.

In other words, the light collecting element included in the at least one of unit pixels includes the first light-transmissive film group and the second light-transmissive film group adjacent to each other. The first light-transmissive film group and the second light transmissive film group have mutually different effective refractive index distributions for the purpose of guiding the at least two types of incident light rays to the light receiving element. The boundary between the first and second light-transmissive film groups is the straight line, and the straight-line boundary is orthogonal to the line which connects the center point of the imaging region and the center point of the unit pixel including the light collecting element.

Accordingly, the solid-state imaging device can guide such two types of light rays having mutually different properties to the light receiving element.

Preferably, the first light-transmissive film group should be closer to the center point of the imaging region than the second light-transmissive film group, and the second light-transmissive film group should have a light refractive index higher than a light refractive index of the first light-transmissive film group.

Preferably, the unit pixel including the multi-structural light collecting element should be disposed, in the imaging region, at a part other than a center part of the imaging region.

Preferably, the position of the boundary in the multi-structural light collecting element should vary depending on the distance from the center point of the imaging region to the unit pixel including the multi-structural light collecting element, and the position of the boundary in the multi-structural light collecting element should be closer to the center point of the unit pixel including the multi-structural light collecting element when the position of the unit pixel including the multi-structural light collecting element is closer to a marginal part of the imaging region.

Preferably, each of the light-transmissive films should have the shape of the concentric arc having a width smaller than or equal to the wavelength of incident light.

Preferably, the center axis of the first light-transmissive film group and the center axis of the second light-transmissive film group should be different from each other.

Preferably, when the unit pixel including the multi-structural light collecting element is disposed in the marginal part of the imaging region, the boundary in the multi-structural light collecting element should pass through the center point of the unit pixel including the multi-structural light collecting element.

Preferably, the multi-structural light collecting element should be a gradient index lens.

Advantageous Effects

The solid-state imaging device according to the present invention is possible to guide two types of light rays having mutually different properties to the light receiving devices provided therein.

BRIEF DESCRIPTION OF DRAWINGS

These and other objects, advantages and features of the invention will become apparent from the following description thereof taken in conjunction with the accompanying drawings that illustrate a specific embodiment of the present invention.

DESCRIPTION OF EMBODIMENT

Hereinafter, an exemplary embodiment according to the present invention is described in detail with reference to the drawings. Although the present invention is described below using the exemplary embodiment and drawings, the present invention is not limited to these examples.

The solid-state imaging device according to this embodiment performs imaging using light incident on an imaging region formed on a flat surface. The solid-state imaging device includes a plurality of unit pixels arranged two-dimensionally in the imaging region. Each of the plurality of unit pixels includes: a light receiving element; and a light collecting element for guiding incident light to the light receiving element. The light collecting element included in at least one of the plurality of unit pixels is a multi-structural light collecting element which includes a first light-transmissive film group and a second light-transmissive film group arranged adjacent to each other. Each of the first light-transmissive film group and the second light-transmissive film group includes a plurality of light-transmissive films each of which has a shape of an arc concentric about the center axis perpendicular to the imaging region. The first light-transmissive film group and the second light-transmissive film group have mutually different effective refractive index distributions for guiding at least two types of incident light rays which make up the incident light to the light receiving element. The first light-transmissive film group and the second light-transmissive film group share a boundary which is a straight line. The boundary is orthogonal to a line which connects the center point of the imaging region and the center point of the unit pixel including the multi-structural light collecting element.

Figure 1:
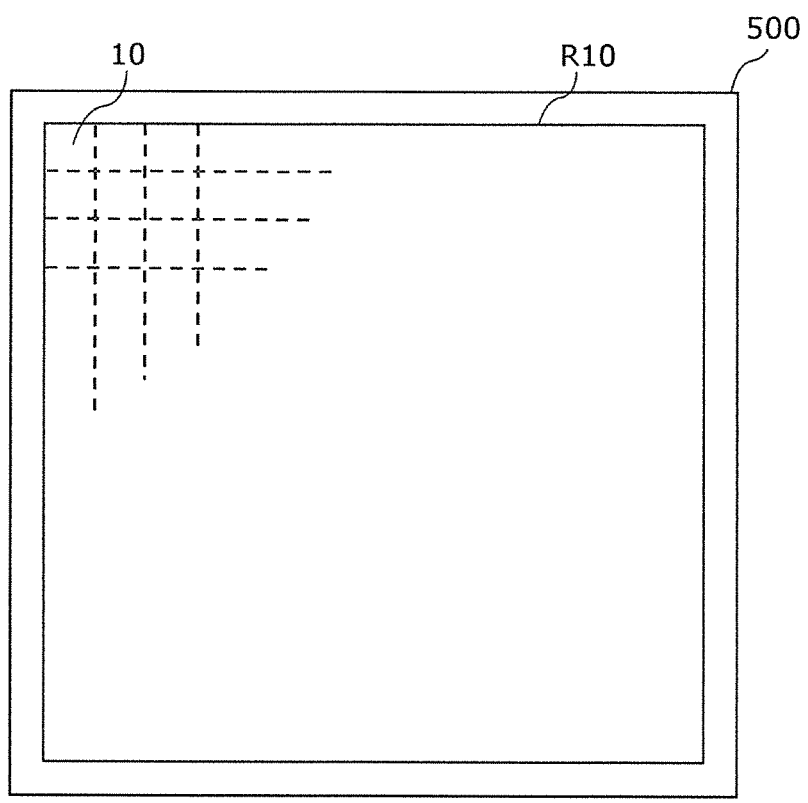
FIG. 1 is a diagram showing an exemplary structure of a solid-state imaging device according to an embodiment.

FIG. 1 is a diagram showing an exemplary structure of a solid-state imaging device 500 according to an embodiment.

With reference to FIG. 1, the solid-state imaging device 500 includes an imaging region R10. The imaging region R10 includes a region formed to have a flat surface. Onto the imaging region R10, light passed through a lens (not shown) is incident. The solid-state imaging device 500 performs imaging using incident light onto the imaging region R10.

Figure 2:
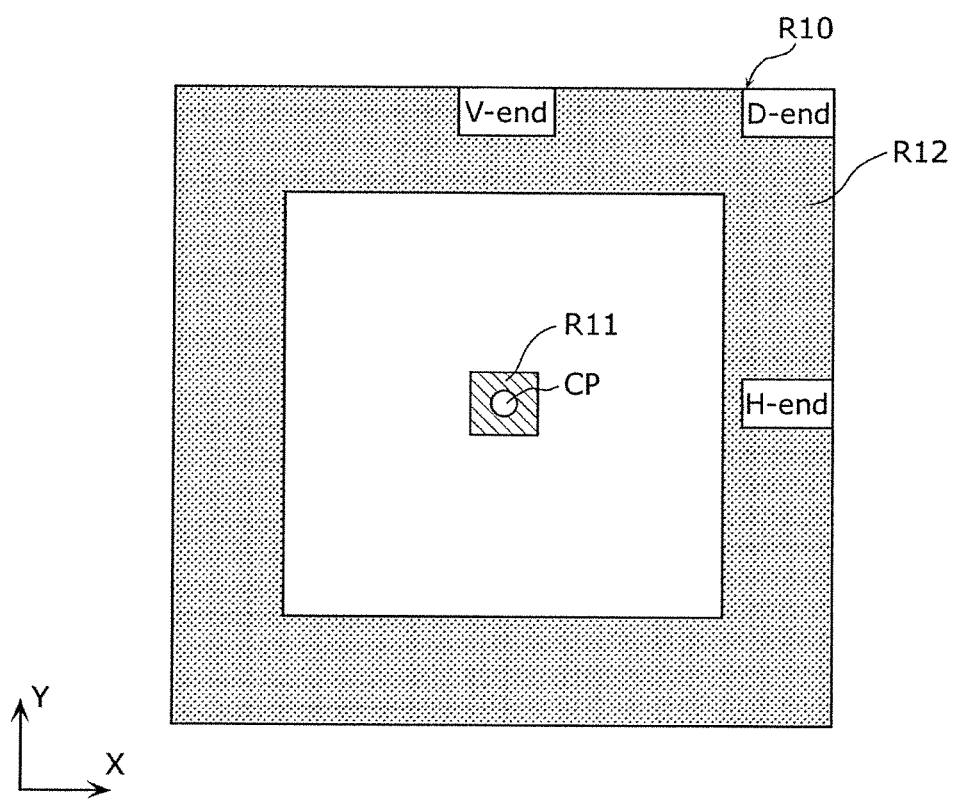
FIG. 2 is a diagram for illustrating an exemplary center part, middle part, and marginal part of an imaging region of the solid-state imaging device.

FIG. 2 is a diagram for illustrating an exemplary center part, middle part, and marginal part of the imaging region R10. The center part of the imaging region R10 is a region R11 which is the center part of the imaging region R10. The marginal part of the imaging region R10 is a region R12. The middle part of the imaging region R10 is the region between the region R11 and the region R12.

Hereinafter, the center part, the middle part, and the marginal part of the imaging region R10 are also referred to as an imaging region center part, an imaging region middle part, and an imaging region marginal part, respectively. Hereinafter, the four corners of the imaging region R10 are referred to image corners or D-ends. Hereinafter, the ends in the Y-axis direction in the imaging region R10 are referred to V-ends. Hereinafter, the ends in the X-axis direction in the imaging region R10 are referred to H-ends.

Hereinafter, the center point of the imaging region R10 is referred to as a center point CP.

With reference to FIG. 1 again, a plurality of unit pixels 10 are arranged in rows and columns at a part other than the center part (imaging region center part) in the imaging region R10. In other words, the plurality of unit pixels are arranged two-dimensionally in the imaging region R10.

Figure 3:
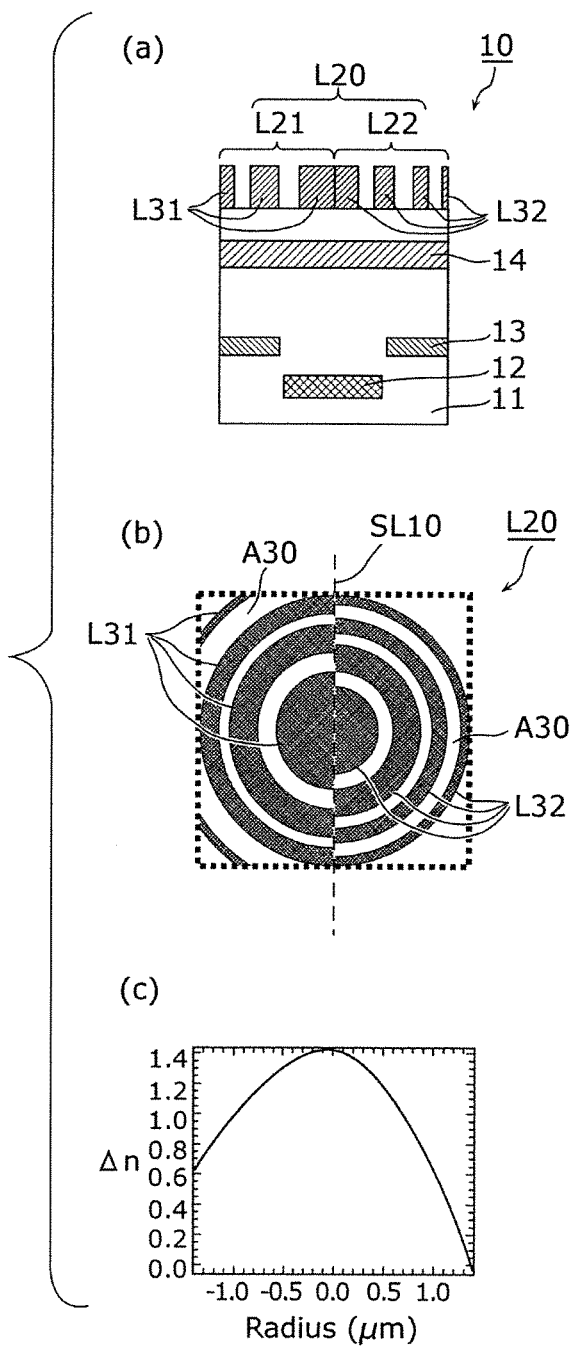
FIG. 3 includes diagrams for illustrating an exemplary structure of one of unit pixels arranged in the imaging region.

FIG. 3 includes diagrams for illustrating an exemplary structure of an exemplary one of the unit pixels 10.

In FIG. 3, (a) is a cross-sectional view of the unit pixel 10.

With reference to (3) of FIG. 3, the unit pixel 10 includes: a semiconductor substrate 11, a light receiving element 12, a wiring 13, a color filter 14, and a light collecting element L20. The unit pixel 10 has a size of 5.6 [μm] or so.

The light receiving element 12 is, for example, an Si photodiode. The wiring 13 is formed using AL or Cu. The color filter 14 allows passage of one of red light, green light, and blue light.

The light collecting element L20 guides light incident to the light collecting element L20 into the light receiving element 12. The light collecting element L20 is a gradient index lens. For example, the light collecting element L20 has a thickness of 1.2 [μm]. The light collecting element L20 is a light collecting element (hereinafter also referred to as a multi-structural light collecting element) including a light-transmissive film group L21 and a second light-transmissive film group L22 adjacent to each other.

As described above, the plurality of unit pixels 10 are arranged in rows and columns in the part other than the center part of the imaging region R10. In other words, at least one unit pixel 10 including a multi-structural light collecting element is arranged, in the imaging region R10, in the part other than the center part of the imaging region R10.

In other words, the light collecting element included in the at least one unit pixel arranged in the imaging region R10 is the multi-structural light collecting element.

In FIG. 3, (b) is an exemplary top view of the light collecting element L20 included in the unit pixel 10 in the imaging region R10.

The first light-transmissive film group L21 includes a plurality of light-transmissive films L31 each of which has the shape of an arc concentric about the center axis perpendicular to the imaging region R10. The second light-transmissive film group L22 includes a plurality of light-transmissive films L32 each of which has the shape of an arc concentric about the center axis perpendicular to the imaging region R10.

In other words, each of the first light-transmissive film group L21 and the second light-transmissive film group L22 has a concentric arc structure.

The center axis of the first light-transmissive film group L21 and the center axis of the second light-transmissive film group L22 are arranged at different positions. The center axis of the first light-transmissive film group L21 and the center axis of the second light-transmissive film group L22 may be arranged at the same position.

The boundary between the first light-transmissive film group L21 and the center axis of the second light-transmissive film group L22 is a boundary SL10 which is a straight line. In other words, the boundary part between the first light-transmissive film group L21 and the center axis of the second light-transmissive film group L22 is positioned along the boundary SL10.

The light-transmissive films L31 and L32 have silicon dioxide ($SiO_2$) as their main component. Each of the first light-transmissive film group L21 and the second light-transmissive film group L22 is formed, for example, based on the volume ratio between $SiO_2$ (n=1.45) and air A30 (n=1.0).

In FIG. 3, (c) is an exemplary graph of effective refractive index distributions of light incident to the imaging region R10 (light collecting element L20). In (c) of FIG. 3, the horizontal axis shows the radii of the light-transmissive films. This effective refractive index distributions are described in detail later.

In (c) of FIG. 3, the left-side effective refractive index distribution starting at the position of 0.0 in the horizontal axis is the effective refractive index distribution of the first light-transmissive film group L21. In addition, the right-side effective refractive index distribution starting at the position of 0.0 in the horizontal axis is the effective refractive index distribution of the second light-transmissive film group L22.

Each of the first light-transmissive film group L21 and the second light-transmissive film group L22 have different effective refractive index distributions of incident light. More specifically, the first light-transmissive film group L21 and the second light transmissive film group L22 have mutually different effective refractive index distributions for the purpose of guiding the at least two types of incident light rays to the light receiving element 12.

Here, the two types of incident light rays includes wide-angle incident light passed through a wide-angle lens and telecentric incident light passed through a telescopic lens. In other word, the two types of incident light rays have mutually different properties.

In other words, the first light-transmissive film group L21 has an effective refractive index distribution for guiding, into the light receiving element 12, the at least two types of light rays incident to the first light-transmissive film group L21. In other words, the second light-transmissive film group L22 has an effective refractive index distribution for guiding, into the light receiving element 12, the at least two types of light rays incident to the second light-transmissive film group L22.

Figure 4:
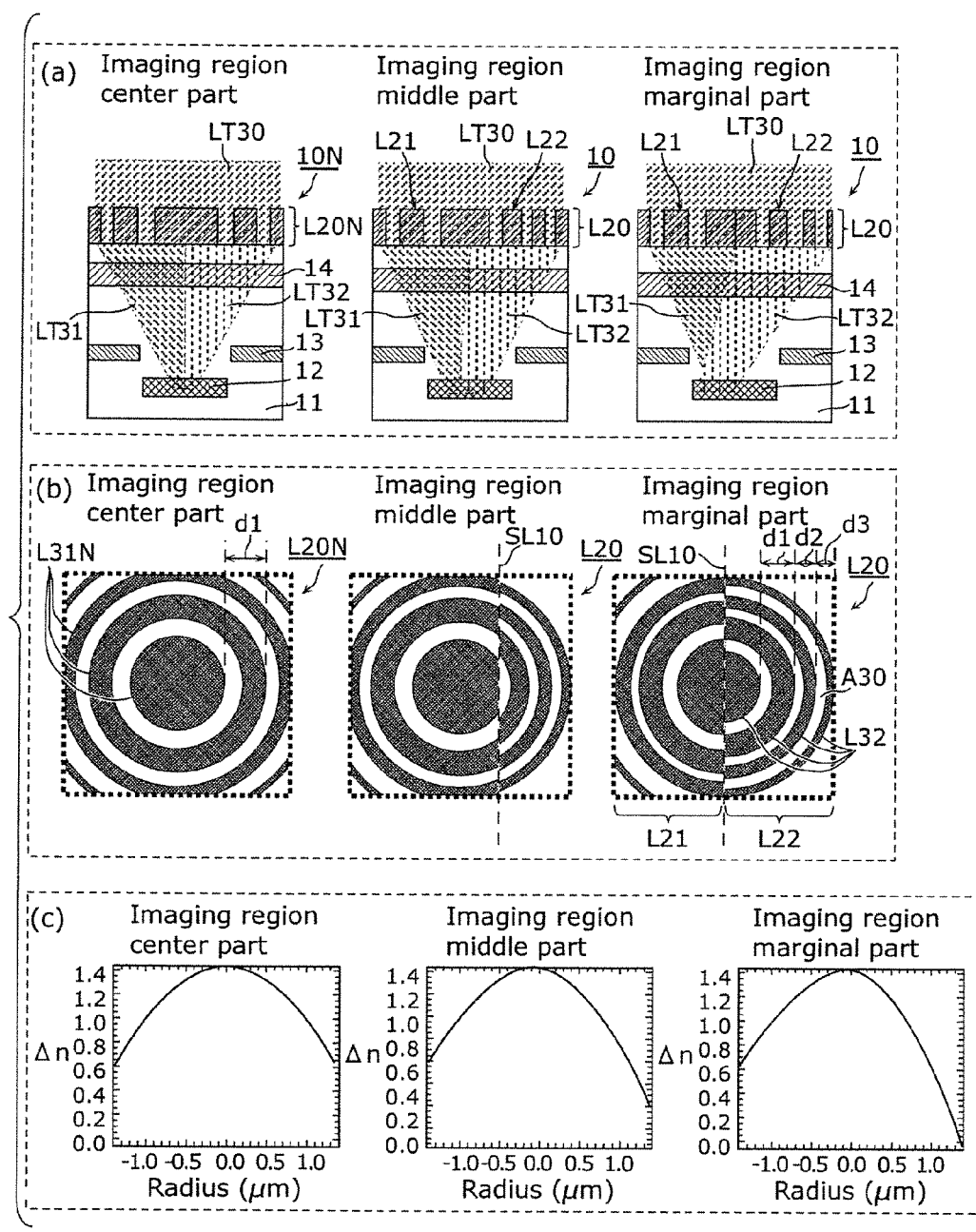
FIG. 4 includes diagrams for illustrating exemplary unit pixels arranged in the respective center part, middle part, and marginal part of the imaging region.

FIG. 4 includes diagrams for illustrating exemplary unit pixels arranged in the respective imaging region center part, imaging region middle part, and imaging region marginal part.

In FIG. 4, (a) is a cross-sectional view of the unit pixels arranged in the respective imaging region center part, imaging region middle part, and imaging region marginal part.

The aforementioned unit pixels 10 are arranged in the respective imaging region middle part and imaging region marginal part. In each of the unit pixels in the imaging region middle part and imaging region marginal part, the first light-transmissive film group L21 is disposed closer to the center point of the imaging region R10 than the second light-transmissive film group L22.

In each of the unit pixels in the imaging region middle part and imaging region marginal part, the first light-transmittive film group L21 refracts incident light LT30 into incident light LT31. Onto the light receiving element 12, the incident light LT31 is incident.

In each of the unit pixels in the imaging region middle part and imaging region marginal part, the second light-transmittive film group L22 refracts incident light LT30 into incident light LT 32. Onto the light receiving element 12, the incident light LT32 is incident.

In the imaging region R10, the refractive index of the light collecting element is higher when the light collecting element is disposed at a position more distant from the center point CP of the imaging region R10.

In other words, the second light-transmissive film group L22 refracts light more significantly than the first light-transmissive film group L21.

At the imaging region center part, a unit pixel 10N is disposed. The unit pixel 10N is different from the unit pixel 10 in the point of including a light collecting element L20N instead of the light collecting element L20 included in the unit pixel 10. The other elements of the unit pixel 10N are the same as those of the unit pixel 10, and thus detailed descriptions thereof are not repeated here.

The light collecting element L20N refracts the incident light LT30 into incident light LT31 and incident light LT32.

In FIG. 4, (b) is an exemplary top view of the light collecting elements included in the unit pixels arranged in the respective imaging region center part, imaging region middle part, and imaging region marginal part.

The light collecting element L20N includes a plurality of light-transmissive films L31N each of which has the shape of an arc concentric about the center axis perpendicular to the imaging region R10. As shown in (b) of FIG. 4, the circumferential radius difference d1 of adjacent ones of the light-transmissive film L31N is, for example, approximately 200 [nm].

The light collecting element L20 of the unit pixel 10 at the image region middle part and image region marginal part has a concentric arc structure asymmetric to the boundary SL10. The position of the boundary SL10 in the multi-structural light collecting element (light collecting element L20) varies depending on the distance from the center point CP of the imaging region R10 to the unit pixel 10 including the multi-functional light collecting element (light collecting element L20).

More specifically, the position of the boundary SL10 in the multi-structural light collecting element (light collecting element L20) is closer to the center point of the unit pixel 10 including the multi-structural light collecting element (light collecting element L20) when the unit pixel 10 including the multi-structural light collecting element (light collecting element L20) is disposed closer to the marginal part of the imaging region R10. Here, the center point of the unit pixel 10 is the center point of the light collecting element L20 (see (b) of FIG. 4) included in the unit pixel 10.

In addition, in the first light-transmissive film group L21 and the second light-transmissive film group L22, the circumferential radius differences d2 and d3 between adjacent ones of the light-transmissive films L32 are smaller than the aforementioned circumferential radius difference d1. In short, the relationship of d1>d2>d3 is satisfied.

Here, each of the light collecting element L20 and the light collecting element L20N is divided into doughnut-shaped segments each having a width corresponding to the circumferential radius difference, and each of the doughnut-shaped segments is referred to as a zone. Among the concentric arcs of the light-transmissive films L32, the innermost concentric arc of the light-transmissive film L32 disposed at the center part of the light collecting element L20 has the largest line width. The light-transmissive film L32 disposed at a position more distant from the center part of the light collecting element L20 has a smaller line width.

In this case, when a current zone has a line width smaller than or approximately equal to the wavelength of incident light, the effective refractive index of the light incident to the zone can be calculated based on the volume ratio between $SiO_2$ (n=1.45) included in the light-transmissive film L32 and air A30 (n=1.0).

In this way, the solid-state imaging device according to the embodiment has a feature of being able to freely control effective refractive index distributions only by changing the line widths of the arcs in the concentric arc structure, that is by changing the volume ratio between the light-transmissive film and air.

It is to be noted that each of the concentric arc-shaped light-transmissive films L31 in the first light-transmissive film group has a line width smaller than or equal to the wave length of incident light A. Here, the incident light A is light (for example, incident light LT31 or incident light LT32) incident to the light receiving element 12. It is to be noted that each of the concentric arc-shaped light-transmissive films L32 in the second light-transmissive film group L22 has a line width smaller than or equal to the wave length of incident light A.

In FIG. 4, (c) is an exemplary graph of effective refractive index distributions of the light collecting elements included in the unit pixels arranged in the respective imaging region center part, imaging region middle part, and imaging region marginal part.

For example, the parabola in the light collecting element L20N of the unit pixel 10N at the imaging region center part shows the effective refractive index for collecting incident light at the focal length f, and is represented according to Expression 1 shown below.

$$\Delta n(x) = \Delta n_{max}[(Ax^2 + Bx \sin \theta)/2\pi + C] \quad \text{(Expression 1)}$$

(A, B, C: Constants)

Here, $\Delta n_{max}$ is a refractive index difference between air and $SiO_2$ which is the material of the light-transmissive film. The refractive index difference is assumed to be 0.45, as an example.

In Expression 1, when the refractive index of the incident-side medium is $n_0$, and the refractive index of the emission-side medium is $n_1$, the parameters are represented according to Expressions 2, 3, and 4 shown below.

$$A = -(k_0 n_1)/2f \quad \text{(Expression 2)}$$

$$B = -k_0 n_0 \quad \text{(Expression 3)}$$

$$k_0 = 2\pi/\lambda \quad \text{(Expression 4)}$$

In this way, it is possible to optimize the lens for each of the focal lengths f, the incident angles and wavelengths of the target incident light. According to Expression 1, the components of the collected light are represented as a quadric of the distance x from the center point of the unit pixel in the circumference direction which is the direction from the center point to the periphery, and the components of the polarized light are represented as the product of the distance x and a trigonometric.

As shown in (c) of FIG. 4, the imaging region center part has an effective refractive index distribution symmetrical to the center point of the unit pixel. In this way, the solid-state imaging device is designed to have the imaging region having unit pixels arranged symmetric to the center point of the light receiving element as in the case of conventional microlenses so that light is always incident onto the imaging region center part in parallel to the optical axis.

For example, as shown in (a) of FIG. 4, in the light collecting element L20 disposed at the imaging region marginal part (the H-end in FIG. 2) of the unit pixel 10, telecentric incident light passes through the first light-transmissive film group L21 and the second light-transmissive film group L22, and forms a focus at a position (closer to the center point of the imaging region R10) closer to the end of the light receiving element 12. Here, the term "telecentric" is used to indicate that the main light ray is approximately parallel to the optical axis. In this way, incident light is collected so that focal points of the respective light collecting elements are overlapped with each other.

Figure 5:
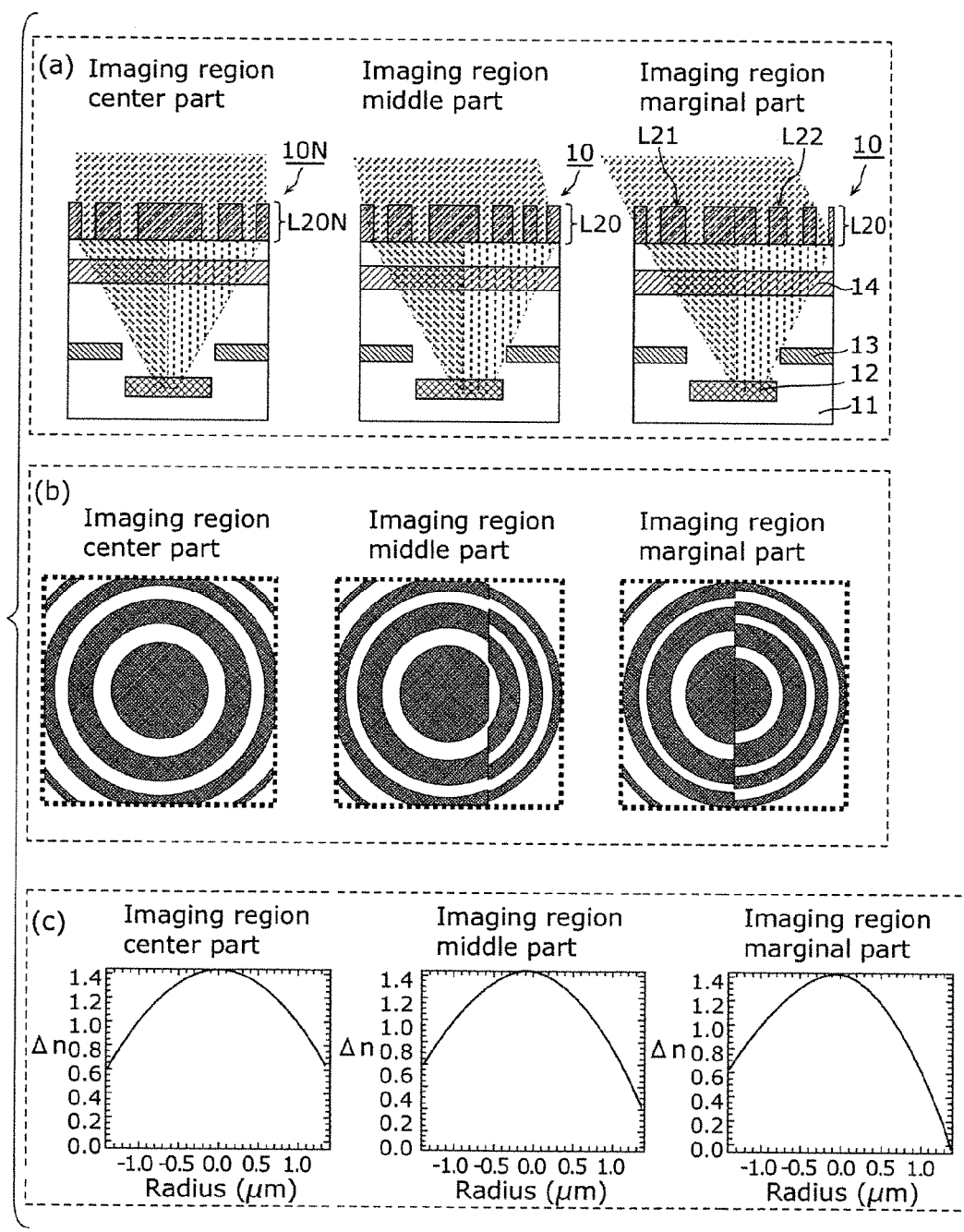
FIG. 5 includes diagrams for illustrating exemplary unit pixels arranged in the respective center part, middle part, and marginal part of the imaging region.

However, as shown in (a) of FIG. 5, in the imaging region middle part and imaging region marginal part, the light incident angle varies depending on the properties of a lens after exchange of lenses. Thus, the solid-state imaging device is designed to have a higher refractive angle in the right-half part of the light collecting element L20 so as to reduce the symmetry in the effective refractive indices in the part closer to the imaging region marginal part.

For example, as shown in (a) of FIG. 5, in the light collecting element L20 disposed at the imaging region marginal part (the H-end in FIG. 2) of the unit pixel 10, wide-angle incident light passed through the first light-transmissive film group L21 and the second light-transmissive film group L22 forms a focus at a position (closer to the marginal part of the imaging region R10) closer to the end of the light receiving element 12.

In FIG. 5, (b) is an exemplary top view of the light collecting elements included in the unit pixels arranged in the respective imaging region center part, imaging region middle part, and imaging region marginal part.

In FIG. 5, (c) is an exemplary graph of effective refractive index distributions of the light collecting elements included in the unit pixels arranged in the respective imaging region center part, imaging region middle part, and imaging region marginal part.

Figure 6:
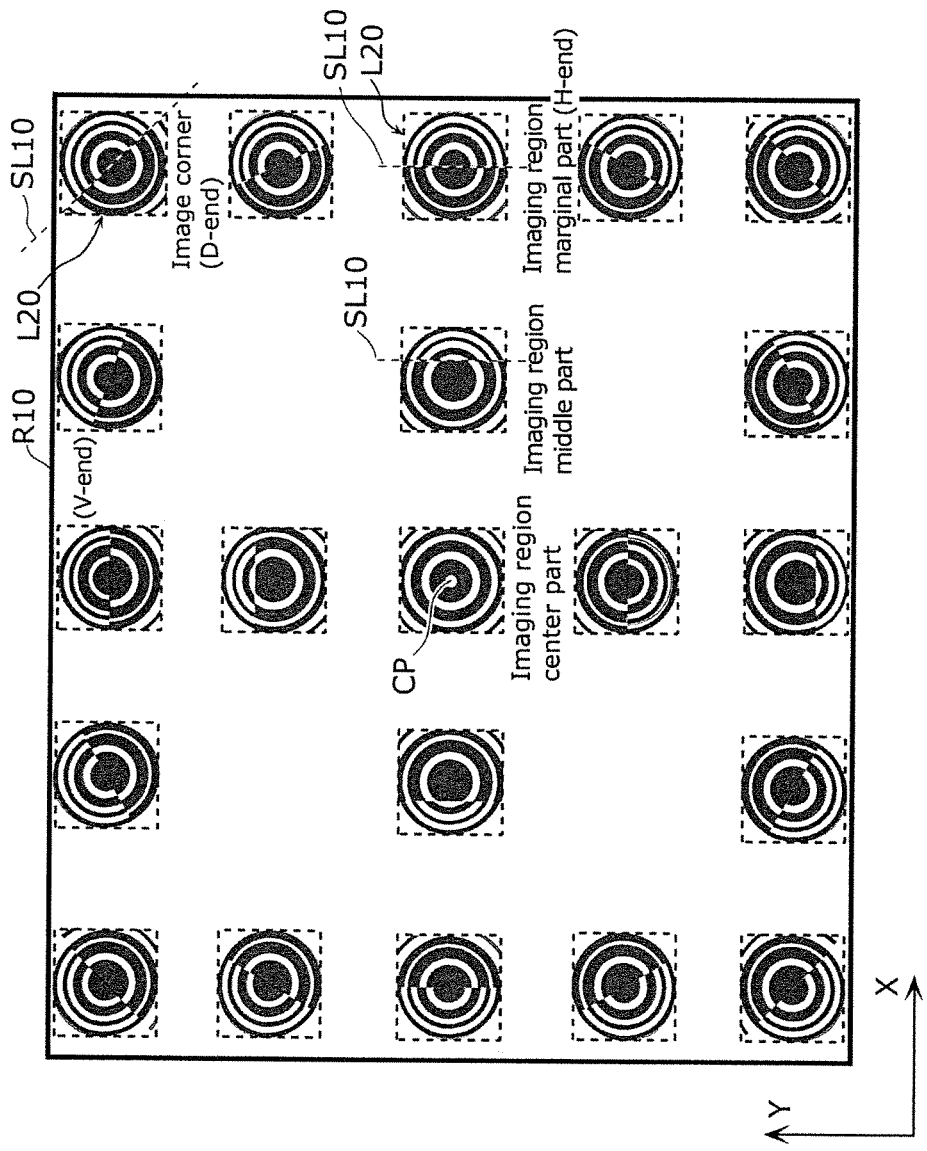
FIG. 6 is a diagram showing an exemplary arrangement of the unit pixels in the imaging region.

FIG. 6 is a diagram showing an exemplary arrangement of unit pixels in the imaging region R10. In other words, FIG. 6 shows an exemplary arrangement of the light collecting elements in the imaging region R10.

In the imaging region marginal part in the X-axis direction in the imaging region R10, asymmetric light collecting elements L20 are disposed along the Y-axis direction. In the imaging region marginal part in the Y-axis direction in the imaging region R, asymmetric light collecting elements L20 are disposed along the X-axis direction.

In addition, in the imaging region middle part of the imaging region R10, for example, the light collecting element L20 shown in (b) of FIG. 4 is disposed. In addition, in the imaging region center part of the imaging region R10, for example, the light collecting element L20N shown in (b) of FIG. 4 is disposed.

In other words, the position of the boundary SL10 in the multi-structural light collecting element (light collecting element L20) varies depending on the distance from the center point CP of the imaging region R10 to the unit pixel 10 including the multi-functional light collecting element (light collecting element L20).

More specifically, the position of the boundary SL10 in the multi-structural light collecting element (light collecting element L20) is closer to the center point of the unit pixel 10 including the multi-structural light collecting element (light collecting element L20) when the unit pixel 10 including the multi-structural light collecting element (light collecting element L20) is disposed closer to the marginal part of the imaging region R10.

In the solid-state imaging device 500 in this embodiment, the multi-structural light collecting element (light collecting element L20) is configured such that the boundary SL10 in the multi-structural light collecting element (light collecting element L20) is orthogonal to the line which connects the center point CP of the imaging region R10 and the center point of the light collecting element L20 (unit pixel).

In other words, the multi-structural light collecting element (light collecting element L20) is configured such that the boundary between the adjacent sets of arcs having different effective refractive indices of the arc-structured light collecting element is orthogonal to the vectors of the coordinates in the X-axis direction and Y-axis direction of the unit pixel.

In other words, the boundary SL10 in the multi-structural light collecting element (light collecting element L20) is orthogonal to the line which connects the center point of the imaging region R10 and the center point of the unit pixel including the multi-structural light collecting element (light collecting element L20).

In other words, the boundary SL10 in the light collecting element L20 disposed at each of the D-ends in the imaging region R10 is orthogonal to the vectors of coordinates in the X and Y directions of the unit pixel.

In addition, as shown in (b) of FIG. 4, the boundary SL10 in the multi-structural light collecting element included in the unit pixel 10 disposed at the marginal part of the imaging region R10 passes through the center point of the unit pixel 10 disposed in the marginal part of the imaging region R10. In other words, when the unit pixel including the multi-structural light collecting element is disposed at the marginal part of the imaging region R10, the boundary SL10 in the multi-structural light collecting element passes through the center point of the unit pixel including the multi-structural light collecting element.

In this way, it is possible to achieve, in the entire imaging region R10, light collection effect as explained with reference to (a) of FIG. 4 and (a) of FIG. 5.

Here, a description is given of the light collecting element L20 disposed at a D-end of the imaging region R10.

Figure 7:
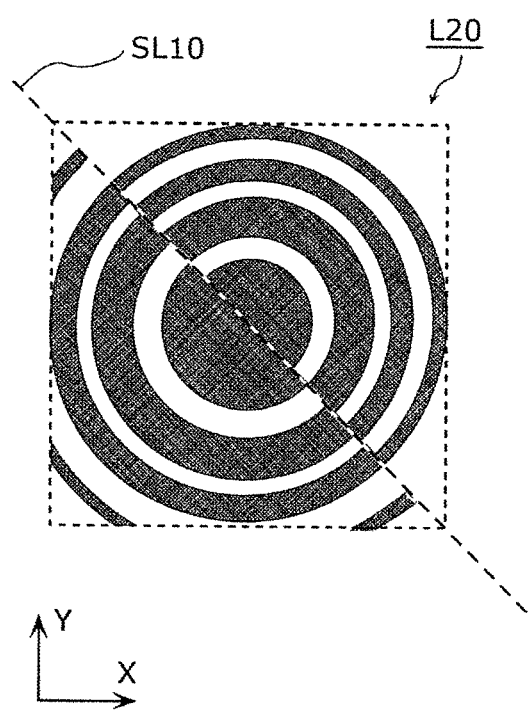
FIG. 7 is a diagram for illustrating an exemplary light collecting element disposed at a D-end of the imaging region.

FIG. 7 is a diagram for illustrating an exemplary light collecting element L20 disposed at the D-end of the imaging region R10.

With reference to FIG. 7, the boundary SL10 in the light collecting element L20 disposed at the D-end has a gradient which varies depending on the ratio between the number of perpendicular pixels and the number of horizontal pixels in the imaging region R10.

Hereinafter, the ratio between the number of perpendicular pixels and the number of horizontal pixels in the imaging region R10 is referred to as an aspect ratio.

For example, when the aspect ratio is 1:1, that is, when the number of perpendicular pixels and the number of horizontal pixels in the imaging region R10 is equal to each other, the boundary SL10 in the light collecting element L20 disposed at the D-end is parallel to the Y-axis rotated by 45 degrees counterclockwise. With this structure, it is possible to achieve equivalent light collection effect all in the H-end, V-end, and D-end of the imaging region R10.

Figure 8:
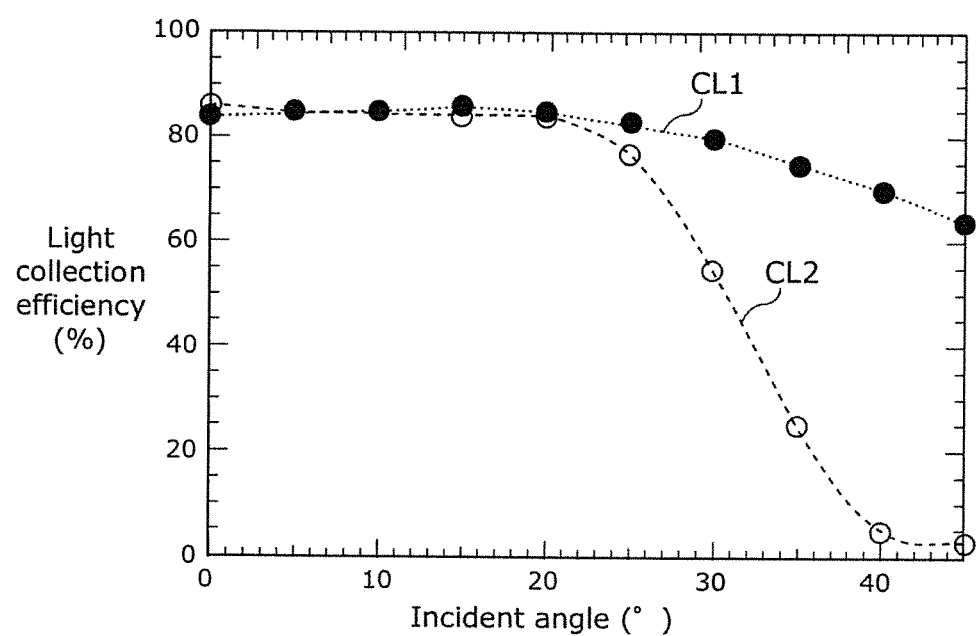
FIG. 8 is a graph showing exemplary incident angle dependence with respect to light collection efficiency of the solid-state imaging device.

FIG. 8 is a graph showing exemplary incident angle dependence with respect to light collection efficiency of the solid-state imaging device. In FIG. 8, the characteristic curve CL1 shows the characteristics of the light collection efficiency of the solid-state imaging device 500 in this embodiment. The characteristic curve CL2 shows, as an example, the characteristics of the light collection efficiency of the solid-state imaging device including unit pixels 10N (shown in (a) of FIG. 4) which are arranged in the entire imaging region R10 and each of which includes a light collecting element.

In this way, the solid-state imaging device 500 in this embodiment is capable of imaging a bright image even in the marginal part due to flat light incident-angle characteristics as shown in the characteristic curve CL1, even when the angle of light incident to the unit pixels changes from a wide angle to a telecentric angle (an angle approximately parallel to the optical axis). In other words, even when the angle of light incident to the unit pixels changes from the wide angle to the telecentric angle, it is possible to prevent that the captured image has a dark marginal part.

In this embodiment, the respective light-transmissive films of the light collecting element L20 respectively have concentric arc shapes. However, these light-transmissive films may respectively have concentric tetragonal, hexagonal, or polygonal shapes instead of such arc shapes.

In this embodiment, the boundary in the light collecting element L20 may be formed either the light-transmissive film L31 (L32) or air A30.

As described above with reference to the drawings, the solid-state imaging device according to this embodiment performs imaging using light incident on an imaging region formed on a flat surface. The solid-state imaging device includes a plurality of unit pixels arranged two-dimensionally in the imaging region. Each of the plurality of unit pixels includes: a light receiving element; and a light collecting element for guiding incident light to the light receiving element. The light collecting element included in at least one of the plurality of unit pixels is a multi-structural light collecting element which includes a first light-transmissive film group and a second light-transmissive film group arranged adjacent to each other. Each of the first light-transmissive film group and the second light-transmissive film group includes a plurality of light-transmissive films each of which has a shape of an arc concentric about the center axis perpendicular to the imaging region. The first light-transmissive film group and the second light-transmissive film group have mutually different effective refractive index distributions for guiding at least two types of incident light rays which make up the incident light to the light receiving element. The first light-transmissive film group and the second light-transmissive film group share a boundary which is a straight line. The boundary is orthogonal to a line which connects the center point of the imaging region and the center point of the unit pixel including the multi-structural light collecting element.

In this way, it is possible to guide two types of light rays having mutually different properties to the light receiving device. Accordingly, it is possible to capture an image that is bright even at the marginal part even when the angle of incident light to the unit pixels changes from a wide angle to a telecentric angle.

Preferably, the first light-transmissive film group should be closer to the center point of the imaging region than the second light-transmissive film group, and the second light-transmissive film group should have a light refractive index higher than a light refractive index of the first light-transmissive film group.

Preferably, the unit pixel including the multi-structural light collecting element should be disposed, in the imaging region, at a part other than a center part of the imaging region.

Preferably, the position of the boundary in the multi-structural light collecting element should vary depending on the distance from the center point of the imaging region to the unit pixel including the multi-structural light collecting element, and the position of the boundary in the multi-structural light collecting element should be closer to the center point of the unit pixel including the multi-structural light collecting element when the position of the unit pixel including the multi-structural light collecting element is closer to a marginal part of the imaging region.

Preferably, each of the light-transmissive films should have the shape of the concentric arc having a width smaller than or equal to the wavelength of incident light.

Preferably, the center axis of the first light-transmissive film group and the center axis of the second light-transmissive film group should be different from each other.

Preferably, when the unit pixel including the multi-structural light collecting element is disposed in the marginal part of the imaging region, the boundary in the multi-structural light collecting element should pass through the center point of the unit pixel including the multi-structural light collecting element.

Preferably, the multi-structural light collecting element should be a gradient index lens.

(Camera)

Next, a description is given of a camera (imaging device) 1000 including the solid-state imaging device 500 according to the embodiment.

Figure 9:
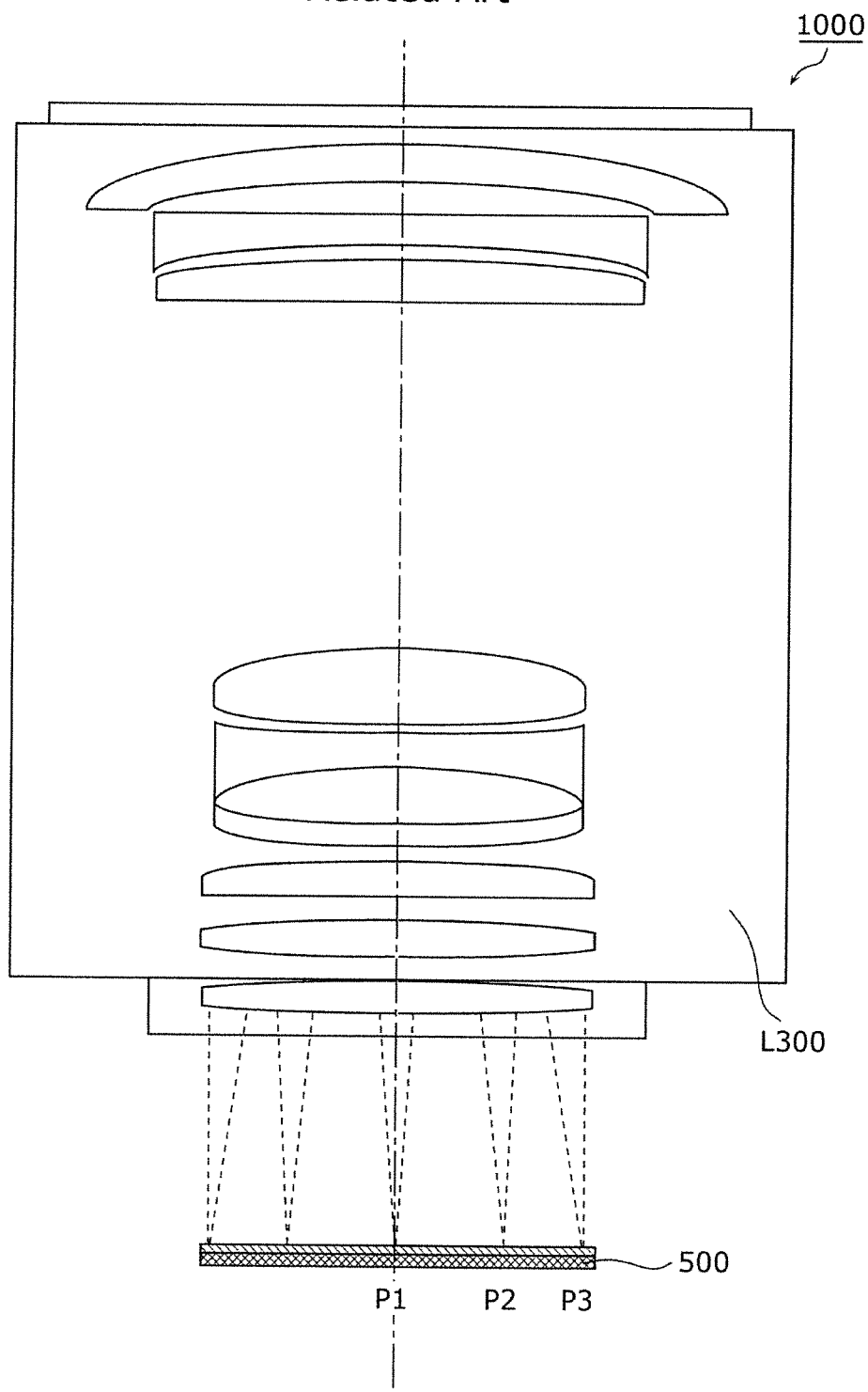
FIG. 9 is a diagram showing an exemplary structure of a camera having the solid-state imaging device.

FIG. 9 is a diagram showing an exemplary structure of the camera 1000 as an example. The camera 1000 is a digital still camera. The camera 1000 is, for example, a single lens reflex digital camera. The camera 1000 is not limited to a digital still camera, and may be, for example, a digital video camera.

The camera 1000 includes an imaging lens L300 and a solid-state imaging device 500.

In FIG. 9, a position P1 corresponding to the center point (the imaging region center part). A point P2 corresponds to an imaging region middle part. A point P3 corresponds to an imaging region marginal part (H-end).

The imaging lens L300 is configured to support imaging in the case where incident light is telecentric to the imaging region R10 in the solid-state imaging device 500 (when the main light ray of incident light is approximately parallel to the optical axis).

COMPARISON EXAMPLE 1

A solid-state imaging device (not shown) according to Comparison Example 1 is described below with reference to the drawings. Hereinafter, the solid-state imaging device (not shown) according to Comparison Example 1 is referred to as a solid-state imaging device JN.

Figure 10:
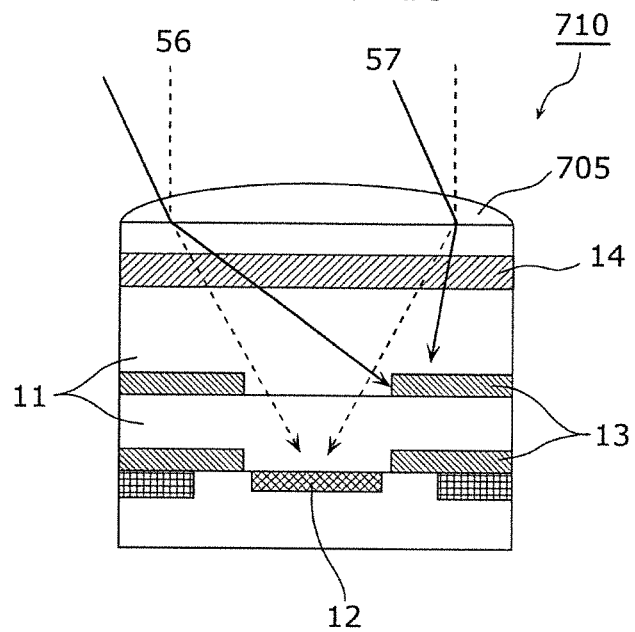
FIG. 10 is a diagram showing an exemplary structure of a general unit pixel formed in a solid-state imaging device according to Comparison Example 1.

FIG. 10 is a diagram showing an exemplary structure of a general unit pixel 710 formed in the solid-state imaging device JN. Unit pixels 710 are arranged two-dimensionally (in rows and columns) in an imaging region of the solid-state imaging device JN.

As shown in FIG. 10, light (incident light 56 shown by broken lines) perpendicularly incident onto a microlens 705 is separated by color filters 14 into color light rays each having a red color (R), a green color (G), or a blue color (B), and the color light rays are converted by the light receiving element 12 into electric signals. Such a microlens 705 is generally used because the microlens 705 can provide a comparatively high light collection efficiency.

Figure 11:
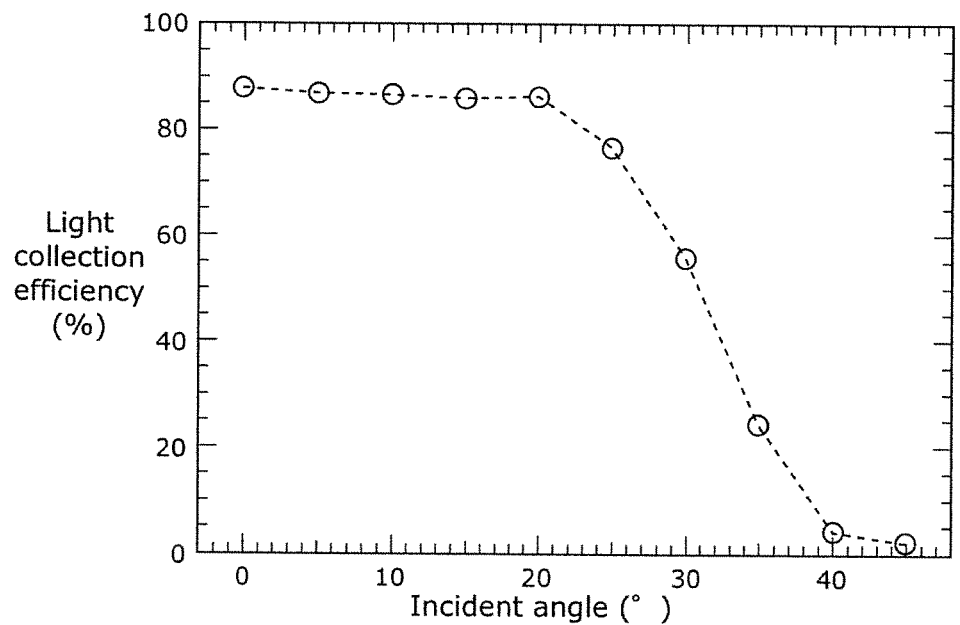
FIG. 11 is a graph showing exemplary incident angle dependence with respect to light collection efficiency of a solid-state imaging device using microlenses according to Comparison Example 1.

However, when the microlens 705 is used, the light collection efficiency decreases depending on light incident angles of signal light. In other words, as shown in FIG. 11, it is possible to collect light (the incident light 56 shown by the broken lines) perpendicularly incident onto the lens highly efficiently, but the light collection efficiency decreases in the case of diagonally incident light (incident light 57 shown by solid lines). This is because the diagonally incident light 57 is blocked by a wiring 13 in the pixel and thus cannot reach the light receiving element 12.

As described above, the unit pixels 710 are arranged two-dimensionally (rows and columns) in the imaging region of the solid-state imaging device JN. For this reason, in the case of incident light having a wide angle, the unit pixel disposed at the center part of the imaging region and each of the unit pixels disposed at the marginal part of the imaging region have different incident angles. This results in the problem that the unit pixels disposed at the marginal part have a light collection efficiency lower than that of the unit pixel disposed at the center part.

Figure 12:
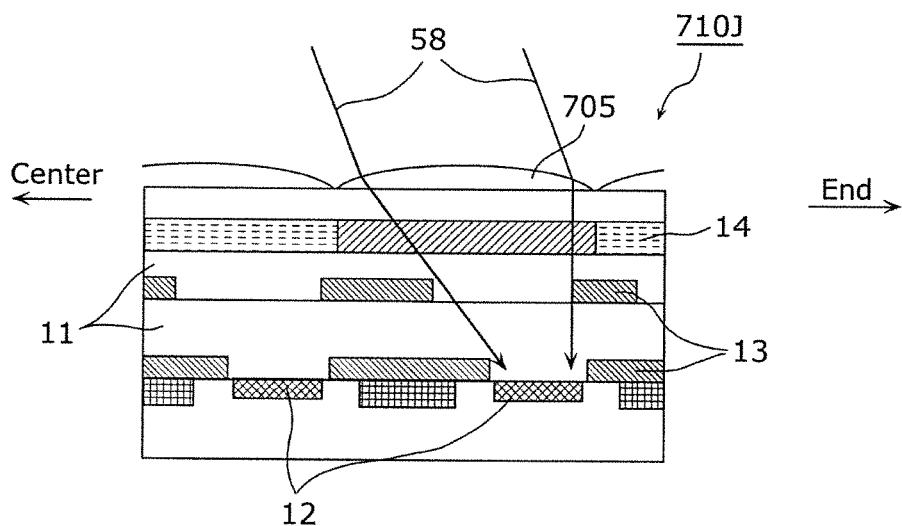
FIG. 12 is a diagram showing an exemplary structure of an exemplary unit pixel arranged in the marginal part of the imaging region of the solid-state imaging device.

FIG. 12 is a diagram showing an exemplary structure of the unit pixel arranged in the marginal part of the imaging region of a solid-state imaging device 710J. Incident light 58 is incident onto the unit pixels arranged at the marginal part of the imaging region with a large incident angle. Thus, the light collection efficiency is increased by shifting (shrinking) the wiring 13 and the light receiving element 12 in the outward direction (end direction).

FIG. 11 is a graph showing exemplary incident angle dependence with respect to light collection efficiency of the solid-state imaging device 710J using microlenses 705. FIG. 11 shows that it is possible to highly efficiently collect incident light having an incident angle of approximately 20 degrees or less. However, FIG. 11 shows that the light collection efficiency of light having a larger incident angle dramatically decreases.

In other words, the unit pixels disposed around the marginal part in the solid-state imaging device 710J collects an amount of light which is approximately 40% of the amount of light collected by the unit pixel disposed at the center part. Thus, the overall sensitivity of the solid-state imaging device 710J is controlled by the sensitivity of the unit pixels around the marginal part.

In addition, the overall sensitivity of the solid-state imaging device 710J further decreases with decrease in the sizes of the pixels. Thus, it is very difficult to apply the solid-state imaging device 710J in a short-focus optical system such as a small digital camera. Furthermore, as another problem, it is impossible to manufacture circuits having a further shrunk size.

However, the solid-state imaging device 500 according to this embodiment solves the aforementioned problems. In other words, the solid-state imaging device 500 makes it possible to shrink the circuit scale more significantly than in the case of the solid-state imaging device 710J. For this reason, the solid-state imaging device 500 can be miniaturized more than the solid-state imaging device 710J.

COMPARISON EXAMPLE 2

A solid-state imaging device according to Comparison Example 2 is described below with reference to the drawings.

Figure 13:
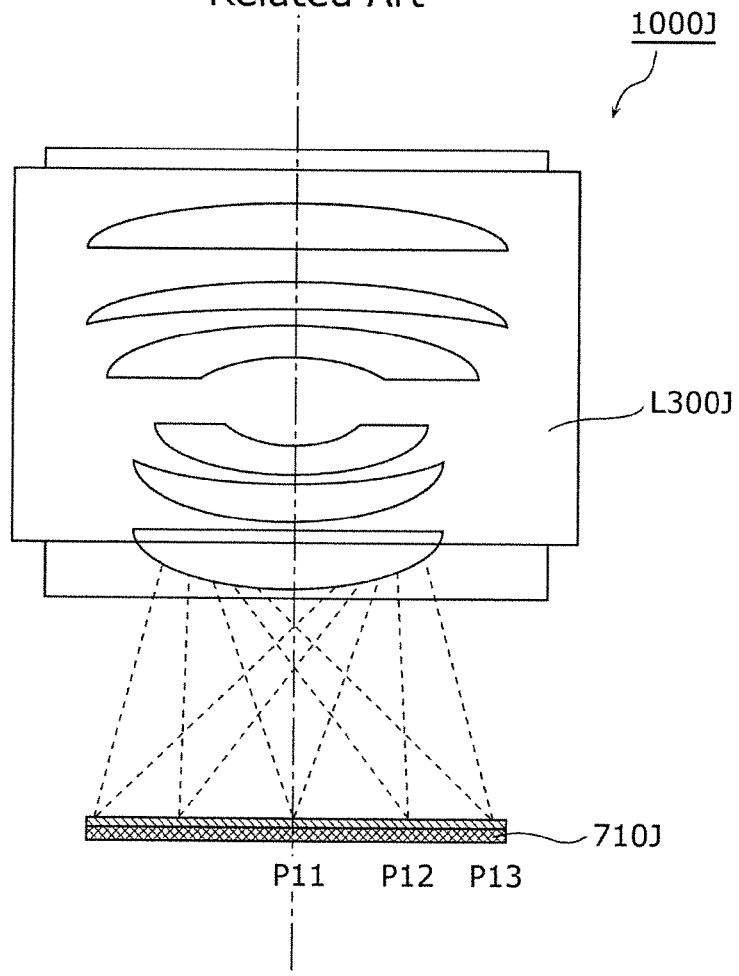
FIG. 13 is a diagram showing an exemplary structure of a camera having a solid-state imaging device according to Comparison Example 2.

FIG. 13 is a diagram showing an exemplary structure of a camera 1000J having the solid-state imaging device 710J according to Comparison Example 2.

The camera 1000J is a digital still camera. The camera 1000J is, for example, a single lens reflex digital camera.

The camera 1000J includes an imaging lens L3003 and a solid-state imaging device 710J. Hereinafter, the center part, the middle part, and the marginal part of the imaging region R710J are also referred to as an imaging region center part, an imaging region middle part, and an imaging region marginal part, respectively. In FIG. 13, positions P11, P12, and P13 are positions respectively corresponding to the imaging region center part, the imaging region middle part, and the imaging region marginal part.

Figure 14:
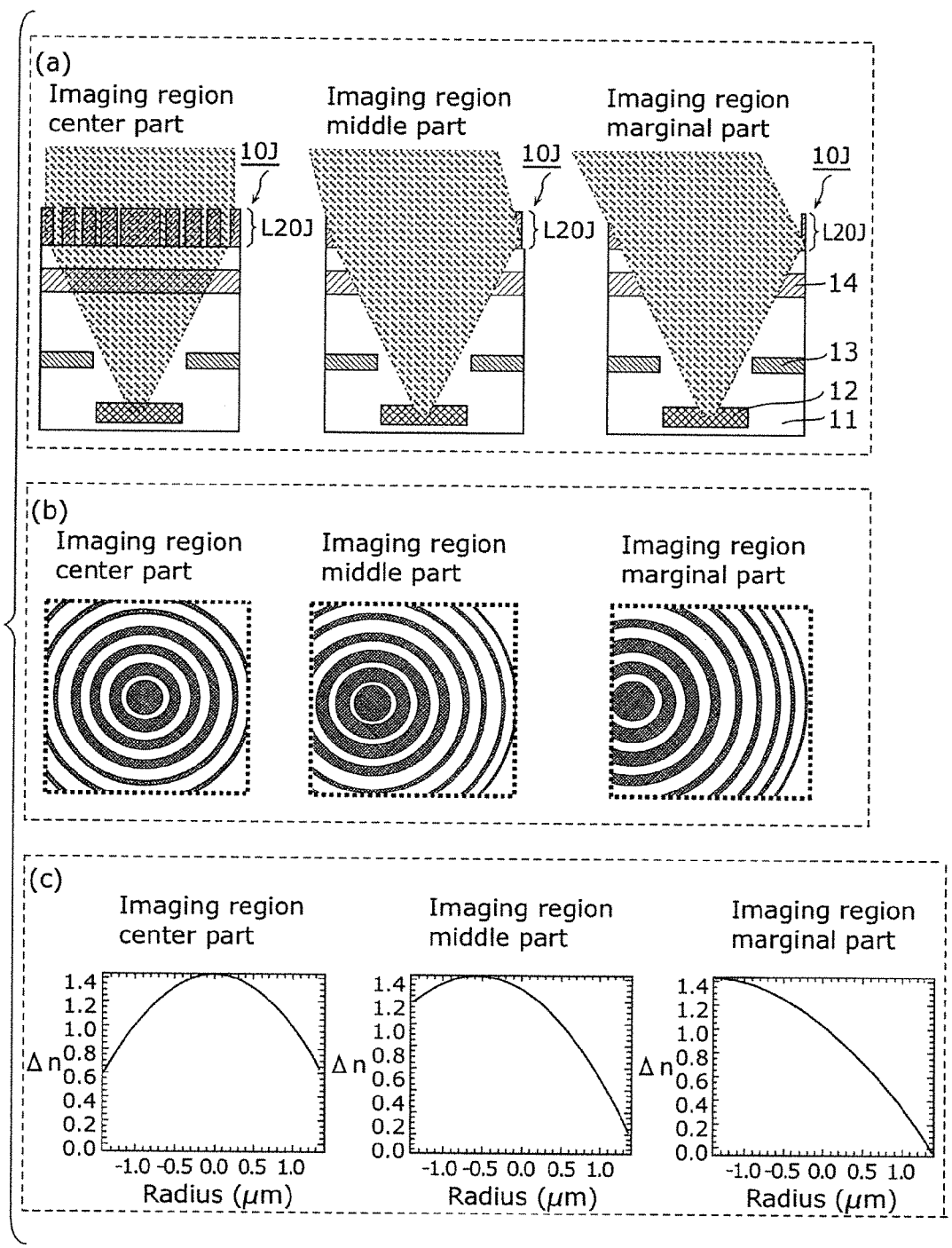
FIG. 14 includes diagrams for illustrating exemplary unit pixels arranged in the respective center part, middle part, and marginal part of the imaging region.

FIG. 14 includes diagrams for illustrating exemplary unit pixels 103 arranged in the respective imaging region center part, imaging region middle part, and imaging region marginal part.

In FIG. 4, (a) is a cross-sectional view of the unit pixels 10J arranged in the respective imaging region center part, imaging region middle part, and imaging region marginal part.

The unit pixel 10J is different from the unit pixel 10 in (a) of FIG. 3 in the point of including a light collecting element L20J instead of the light collecting element L20 included in the unit pixel 10. The other elements of the unit pixel 10J are the same as those of the unit pixel 10, and thus the same detailed descriptions are not repeated here.

In FIG. 14, (b) is an exemplary top view of the light collecting elements L20J included in the unit pixels arranged in the respective imaging region center part, imaging region middle part, and imaging region marginal part.

In FIG. 14, (c) is an exemplary graph of effective refractive index distributions of the light collecting elements L20J included in the unit pixels arranged in the respective imaging region center part, imaging region middle part, and imaging region marginal part.

As shown in FIG. 13, in the case of imaging lenses L300L for wide-angle incident light in the solid-state imaging device 710J according to Comparison Example 2, gradient index lenses (light collecting elements L20J) having different effective refractive indices are respectively used in the imaging region center part, imaging region middle part, and imaging region marginal part as shown in (a) to (c) of FIG. 14.

In this way, even when incident light is incident onto the imaging region marginal part with a large (diagonal) angle with respect to the perpendicular axis of the incident surface, it is possible to collect the incident light to the light receiving element 12, and thereby obtain sensitivity approximately equal to the sensitivity of the center part of the solid-state imaging device 710J.

However, although this lens is suitable for a case where wide-angle light is incident in the camera 1000J, another type of imaging lens may be used in a case where telecentric incident light is incident onto the solid-state imaging device 710J.

Figure 15:
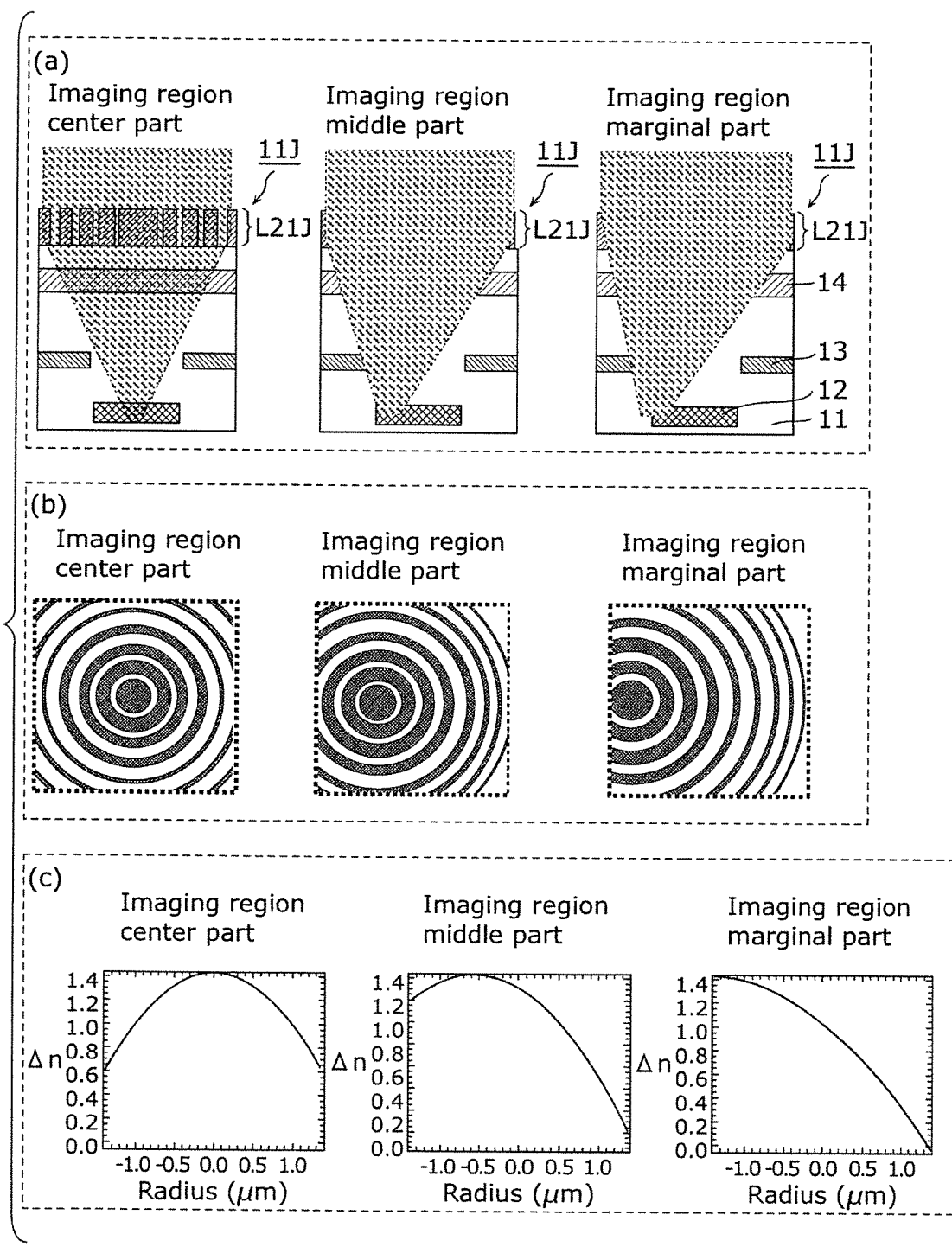
FIG. 15 includes diagrams for illustrating exemplary unit pixels arranged in the respective center part, middle part, and marginal part of the imaging region.

FIG. 15 includes diagrams for illustrating exemplary unit pixels 11J arranged in the respective imaging region center part, imaging region middle part, and imaging region marginal part.

In FIG. 15, (a) is a cross-sectional view of the unit pixels 11J arranged in the respective imaging region center part, imaging region middle part, and imaging region marginal part.

The unit pixel 11J is different from the unit pixel 10J in the point of including a light collecting element L21J instead of the light collecting element L20J included in the unit pixel 10J. The other elements of the unit pixel 11J are the same as those of the unit pixel 10J, and thus the same detailed descriptions are not repeated here.

Hereinafter, the solid-state imaging device including unit pixels 11J is also referred to as a solid-state imaging device J.

The unit pixels 11J are arranged in a matrix in the imaging region of the solid-state imaging device 3.

In FIG. 15, (b) is an exemplary top view of the light collecting elements L21J included in the unit pixels 11J respectively arranged in the imaging region center part, the imaging region middle part, and the imaging region marginal part.

In FIG. 15, (c) is an exemplary graph of effective refractive index distributions of the light collecting elements L21J included in the unit pixels 11J respectively arranged in the imaging region center part, the imaging region middle part, and the imaging region marginal part.

The light collecting element L21J is a gradient index lens suitable for wide-angle incident light.

In this case, as shown in (a) to (c) of FIG. 15, the solid-state imaging device including the light collecting element L21J has a problem of inevitably producing an image having a dark marginal part because the unit pixels in the imaging region marginal part can only receive light deflected greatly and thus cannot guide a sufficient amount of light to the light receiving element 12.

However, the solid-state imaging device 500 according to this embodiment solves the aforementioned problems.

The light collecting element L20 included in at least one of the unit pixels 10 arranged in the imaging region R10 of the solid-state imaging device 500 is configured to include a first light-transmissive film group L21 and a second light-transmissive film group L22 which are adjacent to each other. More specifically, the first light-transmissive film group L21 and the second light transmissive film group L22 have mutually different effective refractive index distributions for the purpose of guiding the at least two types of incident light rays to the light receiving element 12.

In addition, the boundary between the first light-transmissive film group L21 and the second light-transmissive film group L22 is a straight line, and the straight-line boundary SL10 is orthogonal to the line which connects the center point of the imaging region R10 and the center point of the unit pixel 10 including the light collecting element L20.

Accordingly, the solid-state imaging device 500 can guide, to the light receiving device, such two types of light rays having mutually different properties after respectively passing through a wide-angle lens and a telescopic lense. In this way, the solid-state imaging device 500 can increase the brightness in the marginal part of a resulting image more significantly than the solid-state imaging device J.

In other words, the solid-state imaging device 500 according to this embodiment can support both the cases of wide-angle incident light and telecentric incident light. In other words, the solid-state imaging device 500 can support two types of light rays having different refractive index distributions.

Although the solid-state imaging device 500 according to the exemplary embodiment of the present invention has been described above, the present invention is not limited to the embodiment. Those skilled in the art will readily appreciate that many modifications are possible in the exemplary embodiment without materially departing from the novel teachings and advantages of the present invention. Accordingly, all such modifications are intended to be included within the scope of the present invention. For example, all embodiments obtainable by modifying the exemplary embodiment and arbitrarily combining the structural elements of different embodiments are included in the scope of the present invention unless these embodiments materially depart from the principles and spirit of the present invention.

The embodiment disclosed above is exemplary in all respects, and thus is not intended to limit the present invention. The scope of the present invention is defined by the Claims not by the Description, and all possible modifications having equivalents to those in the Claims and within the scope of the Claims are intended to be included in the present invention.

Industrial Applicability

The solid-state imaging device according to the present invention is applicable to digital still cameras, digital video cameras, or mobile phones with a camera, and the like, and thus is industrially applicable.

The invention claimed is:

1. A solid-state imaging device comprising:
a plurality of unit pixels arranged two-dimensionally in an imaging region, and each of the plurality of unit pixels including:
a light receiving element; and
a light collecting element for guiding incident light to the light receiving element,
wherein the plurality of unit pixels includes a first unit pixel disposed at a corner part of the imaging region and having a first light collecting element,
the first light collecting element includes a first light-transmissive film group and a second light-transmissive film group arranged adjacent to each other,
each of the first light-transmissive film group and the second light-transmissive film group includes a plurality of light-transmissive films each of which has a shape of an arc concentric about a center axis perpendicular to the imaging region,
the first light-transmissive film group and the second light-transmissive film group have mutually different effective refractive index distributions,
the first light-transmissive film group and the second light-transmissive film group share a first boundary which is a straight line,
the first boundary is orthogonal to a line which connects a center point of the imaging region and a center point of the first unit pixel,
the first light-transmissive film group is closer to the center point of the imaging region than the second light-transmissive film group, and
the second light-transmissive film group has a light refractive index higher than a light refractive index of the first light-transmissive film group.

2. The solid-state imaging device according to claim 1,
wherein the plurality of unit pixels includes a second unit pixel disposed, in the imaging region, at a part other than a center part of the imaging region,
the second unit pixel includes a second light collecting element,
the second light collecting element includes a third light-transmissive film group and a fourth light-transmissive film group arranged adjacent to each other,
each of the third light-transmissive film group and the fourth light-transmissive film group includes a plurality of light-transmissive films each of which has a shape of an arc concentric about a center axis perpendicular to the imaging region,
the third light-transmissive film group and the fourth light-transmissive film group have mutually different effective refractive index distributions, the third light-transmissive film group and the fourth light-transmissive film group share a second boundary which is a straight line, and the second boundary is orthogonal to a line which connects the center point of the imaging region and a center point of the second unit pixel.

3. The solid-state imaging device according to claim 2, wherein a position of the second boundary in the second light collecting element is closer to the center point of the second unit pixel when a position of the second unit pixel is closer to a marginal part of the imaging region.

4. The solid-state imaging device according to claim 3, wherein each of the light-transmissive films has the shape of the concentric arc having a width smaller than or equal to a wavelength of incident light.

5. The solid-state imaging device according to claim 4, wherein a center axis of the first light-transmissive film group and a center axis of the second light-transmissive film group are different from each other.

6. The solid-state imaging device according to claim 5, wherein the first boundary in the first light collecting element passes through the center point of the first unit pixel.

7. The solid-state imaging device according to claim 6, wherein the first light collecting element is a gradient index lens.

8. The solid-state imaging device according to claim 1, wherein the plurality of unit pixels includes a second unit pixel disposed, in the imaging region, at a part other than a center part of the imaging region, the second unit pixel includes a second light collecting element, the second light collecting element includes a third light-transmissive film group and a fourth light-transmissive film group arranged adjacent to each other, each of the third light-transmissive film group and the fourth light-transmissive film group includes a plurality of light-transmissive films each of which has a shape of an arc concentric about a center axis perpendicular to the imaging region, the third light-transmissive film group and the fourth light-transmissive film group have mutually different effective refractive index distributions, the third light-transmissive film group and the fourth light-transmissive film group share a second boundary which is a straight line, and the second boundary is orthogonal to a line which connects the center point of the imaging region and a center point of the second unit pixel.

9. The solid-state imaging device according to claim 8, wherein a position of the second boundary in the second light collecting element is closer to the center point of the second unit pixel when a position of the second unit pixel is closer to a marginal part of the imaging region.

10. The solid-state imaging device according to claim 1, wherein each of the light-transmissive films has the shape of the concentric arc having a width smaller than or equal to a wavelength of incident light.

11. The solid-state imaging device according to claim 1, wherein a center axis of the first light-transmissive film group and a center axis of the second light-transmissive film group are different from each other.

12. The solid-state imaging device according to claim 1, wherein the first boundary in the first light collecting element passes through the center point of the first unit pixel.

13. The solid-state imaging device according to claim 1, wherein the first light collecting element is a gradient index lens.

14. A solid-state imaging device comprising:

a plurality of unit pixels arranged two-dimensionally in an imaging region, and each of the plurality of unit pixels including:

a light receiving element; and a light collecting element for guiding incident light to the light receiving element, wherein the plurality of unit pixels includes a first unit pixel having a first light collecting element, the first light collecting element includes a first light-transmissive film group and a second light-transmissive film group arranged adjacent to each other, each of the first light-transmissive film group and the second light-transmissive film group includes a plurality of light-transmissive films each of which has a shape of an arc concentric about a center axis perpendicular to the imaging region, the first light-transmissive film group and the second light-transmissive film group have mutually different effective refractive index distributions, the first light-transmissive film group and the second light-transmissive film group share a first boundary which is a straight line, and a position of the first boundary in the first light collecting element is closer to the center point of the first unit pixel when a position of the first unit pixel is closer to a marginal part of the imaging region.

15. The solid-state imaging device according to claim 14, wherein the first light-transmissive film group is closer to the center point of the imaging region than the second light-transmissive film group, and the second light-transmissive film group has a light refractive index higher than a light refractive index of the first light-transmissive film group.

16. The solid-state imaging device according to claim 14, wherein each of the light-transmissive films has the shape of the concentric arc having a width smaller than or equal to a wavelength of incident light.

17. The solid-state imaging device according to claim 14, wherein a center axis of the first light-transmissive film group and a center axis of the second light-transmissive film group are different from each other.

18. The solid-state imaging device according to claim 14, wherein the first light collecting element is a gradient index lens.

* * * * *